(12) United States Patent
Jiang

(10) Patent No.: US 12,305,841 B1
(45) Date of Patent: May 20, 2025

(54) TOUCH TYPE SENSOR LANTERN

(71) Applicant: Yanyu Jiang, Ningbo (CN)

(72) Inventor: Yanyu Jiang, Ningbo (CN)

( * ) Notice: Subject to any disclaimer, the term of this patent is extended or adjusted under 35 U.S.C. 154(b) by 0 days.

(21) Appl. No.: 18/675,140

(22) Filed: May 28, 2024

(30) Foreign Application Priority Data

Apr. 16, 2024 (CN) .......................... 202420791227.1

(51) Int. Cl.
  *F21V 23/04* (2006.01)
  *F21S 6/00* (2006.01)
  *F21S 10/02* (2006.01)
  *F21V 15/01* (2006.01)

(52) U.S. Cl.
  CPC .......... *F21V 23/0485* (2013.01); *F21S 6/001* (2013.01); *F21S 10/023* (2013.01); *F21V 15/01* (2013.01)

(58) Field of Classification Search
  CPC ...... F21V 23/0485; F21V 15/01; F21S 6/001; F21S 10/023
  USPC .......................................................... 362/257
  See application file for complete search history.

(56) References Cited

U.S. PATENT DOCUMENTS

| | | | | |
|---|---|---|---|---|
| 6,511,205 B1 * | 1/2003 | Predd | ................... | B60Q 1/0088 |
| | | | | 439/672 |
| 10,517,224 B2 * | 12/2019 | Tori | .......................... | A01G 5/04 |
| 2015/0055330 A1 * | 2/2015 | Xu | .......................... | F21S 9/032 |
| | | | | 362/183 |
| 2015/0138762 A1 * | 5/2015 | Shing | ...................... | F21S 9/037 |
| | | | | 362/183 |
| 2022/0112995 A1 * | 4/2022 | Li | .......................... | F21S 10/046 |

FOREIGN PATENT DOCUMENTS

| CN | 207094456 U | 3/2018 |
|---|---|---|
| CN | 208703706 U | 4/2019 |
| CN | 217584145 U | 10/2022 |

* cited by examiner

*Primary Examiner* — Elmito Breval
*Assistant Examiner* — Hana S Featherly
(74) *Attorney, Agent, or Firm* — Nitin Kaushik

(57) ABSTRACT

Disclosed is a touch type sensor lantern. The touch type sensor lantern includes an electronic candle main body capable of simulating a candle to give out light, and a lantern outer cover with a base, where the electronic candle main body is placed in the lantern outer cover and laid on the base, light transmitting glass allowing people to see through is arranged on the lantern outer cover. The sensor switch, at an upper part of the lantern outer cover, allows users to conveniently turn on/off the candle by it. This addresses the shortcomings of the previous design, in which users are required to turn over the entire lantern in order to operate a switch button, thereby increasing the operational ease and convenience of using the lantern. Consequently, this enhances the user experience.

9 Claims, 5 Drawing Sheets

TOUCH TYPE SENSOR LANTERN

CROSS-REFERENCE TO RELATED APPLICATIONS

The application claims priority to Chinese patent application No. 202420791227.1, filed on Apr. 16, 2024, the entire contents of which are incorporated herein by reference.

TECHNICAL FIELD

The present invention relates to the technical field of lanterns, and in particular to a touch type sensor lantern.

BACKGROUND

A lantern is a type of antique lamps and lanterns in which a candle is placed for indoor or outdoor lighting. The lantern becomes one of people's favorite lighting fixtures due to antique design. The existing lanterns are usually divided into two types: one is a traditional lantern that uses candles and kerosene as raw materials to burn for lighting, and the other is a modern lantern that retains an outer cover of a traditional lantern and uses electric lamps instead of the candles or the kerosene as a lighting source.

For example, the Chinese invention patent with US201220378191.1 (Publication No. CN 202791366U) has disclosed a "NOVEL ELECTRONIC CANDLE LANTERN". The novel electronic candle lantern includes a lantern housing and an electronic candle, where the lantern housing includes a base, a hollow drum that is easy to protrude is arranged at a bottom of the base, a buckle is arranged at an upper edge of the hollow drum, a through hole is formed in a center position of the buckle, and the electronic candle is fixedly arranged on the base by a screw penetrating through the through hole. The electronic candle is a flickering LED lamp. A dry battery and a switch are arranged at a bottom of the electronic candle. A handle is further arranged at a top of the lantern housing. The candle lantern has no burning flames when used, and the candle is not liable to detach from the base, whereby the candle lantern is safe and reliable.

However, there are also problems with the candle lantern using the above structure. As the switch for controlling switching on and off of the electronic candle is located at the bottom of the electronic candle, the electronic candle and the base are fixed together, and the entire candle lantern needs to be overturned to switch on or off the switch button each time the electronic candle is switched on or off, which is cumbersome to operate, thereby affecting use experience of users.

Therefore, it is a pressing problem for those skilled in the art to provide a way of easily controlling whether the lantern is lit or not, as well as how to easily control the light colours of the lantern without overturning the candle lantern.

SUMMARY

The technical problem to be solved by the present invention is to provide a touch type sensor lantern which can easily control whether the LED lantern turns on/off & changes colours without overturning the candle lantern in response to the above technical status.

To solve the above technical problem, the present invention adopts the following technical solution: the touch type sensor lantern includes an electronic candle main body capable of simulating a candle to give out light, and a lantern outer cover with a base, where the electronic candle main body is placed in the lantern outer cover and laid on the base, light transmitting glass allowing people to see through is arranged on the lantern outer cover, a sensor switch convenient for a human body to touch is also arranged at an upper part of the lantern outer cover, a circuit board for controlling is arranged on the electronic candle main body, the circuit board and the sensor switch are electrically connected together through a wire from bottom to top to form a control loop, and whether the electronic candle main body gives out light or not and light colours of light given out are controlled by touching the sensor switch.

In order to optimize the overall structure of the lantern outer cover, whereby the lantern outer cover can better accommodate the electronic candle main body and the sensor switch, preferably, the lantern outer cover further includes a light transmitting barrel (the entire part of the lantern without a top and a bottom (including glass) and a top cap, the light transmitting barrel is arranged at an upper part of the base, the base is arranged at a top of the light transmitting barrel in a covering manner, the light transmitting glass is arranged on a side wall of the light transmitting barrel, the sensor switch is arranged on the top cap, and the wire penetrates through the light transmitting barrel from bottom to top to be connected to the sensor switch.

In order to conveniently fix the wire and avoid the wire from being exposed outside to affect appearance, preferably, a plurality of wire fixing clips used for fixing the wire are arranged on an inner side wall of the light transmitting barrel, and are arranged in a spacing manner in a length direction of the light transmitting barrel.

In order to enable the lantern outer cover to have better light transmittance, preferably, a plurality of light transmitting holes (the entire part of the lantern without a top and a bottom (large holes without glass) used for allowing light to transmit are formed in a side wall of the light transmitting barrel in a circumferential direction in a penetrating manner, the light transmitting glass is mounted on each light transmitting hole, and fixing buckles for fixing the light transmitting glass are further arranged on the light transmitting barrel.

In order to enable the lantern to be more convenient to use and enable the lantern to be more conveniently maintained and replaced at a later stage, preferably, a door body which can be opened or closed is further hinged to a side wall of the light transmitting barrel, the light transmitting holes are formed in the door body in a penetrating manner, the light transmitting glass is further arranged on the light transmitting holes of the door body, and a door lock is further arranged between the door body and the light transmitting barrel.

In order to enable the electronic candle main body to be better mounted on the base of the lantern outer cover, preferably, support feet used for allowing the electronic candle main body to be mounted are arranged on the base, a battery compartment used for allowing batteries to be mounted is arranged at a bottom of the electronic candle main body, and an operation hole enabling the battery compartment to be exposed outside is further formed in the base in a penetrating manner.

In order to enable the whole electronic candle to be better controlled, whereby the electronic candle can have a dual control function, preferably, a slide switch capable of controlling the electronic candle main body to give out light or not is further arranged at a bottom of the electronic candle main body, the slide switch, the circuit board, the sensor switch, and the batteries placed in the battery compartment are electrically connected together to form the control loop, on and off of a main line are realized by controlling the slide switch, and the slide switch is correspondingly arranged above the operation hole, whereby the slide switch can be toggled back and forth conveniently.

In order to enable the lantern to be conveniently hung outdoors, preferably, a hanging ring or a pothook which can be overturned up and down is arranged at a top of the top cap.

In order to enable that the lantern looks like traditional lanterns, preferably, a plurality of air ventilation holes capable of communicating with the light transmitting barrel are formed in the top cap.

In order to enable the lantern to be more practical during use, preferably, the sensor switch can further control light colours of light given out by the electronic candle main body.

Compared with the prior art, the touch type sensor lantern disclosed by the present invention has the advantages that the electronic candle main body is placed in the lantern outer cover and laid on the base, the light transmitting glass allowing people to see through is arranged on the lantern outer cover, the sensor switch convenient for a human body to touch is arranged at an upper part of the lantern outer cover, and a wire which is connected to a circuit board is arranged, whereby the wire and the sensor switch are electrically connected together from bottom to top to form the control loop, a user can conveniently control whether the electronic candle main body gives out light or not and can also control the light colours of the light given out by gently touching the sensor switch located at an upper part of the lantern outer cover. This design addresses the disadvantage of the conventional design, whereby the entire lantern must be overturned in order to operate the switch button. The touch type sensor lantern is more simple and convenient to operate, and further user experience of the users is improved.

DETAILED DESCRIPTION OF THE EMBODIMENTS

Figure 1:
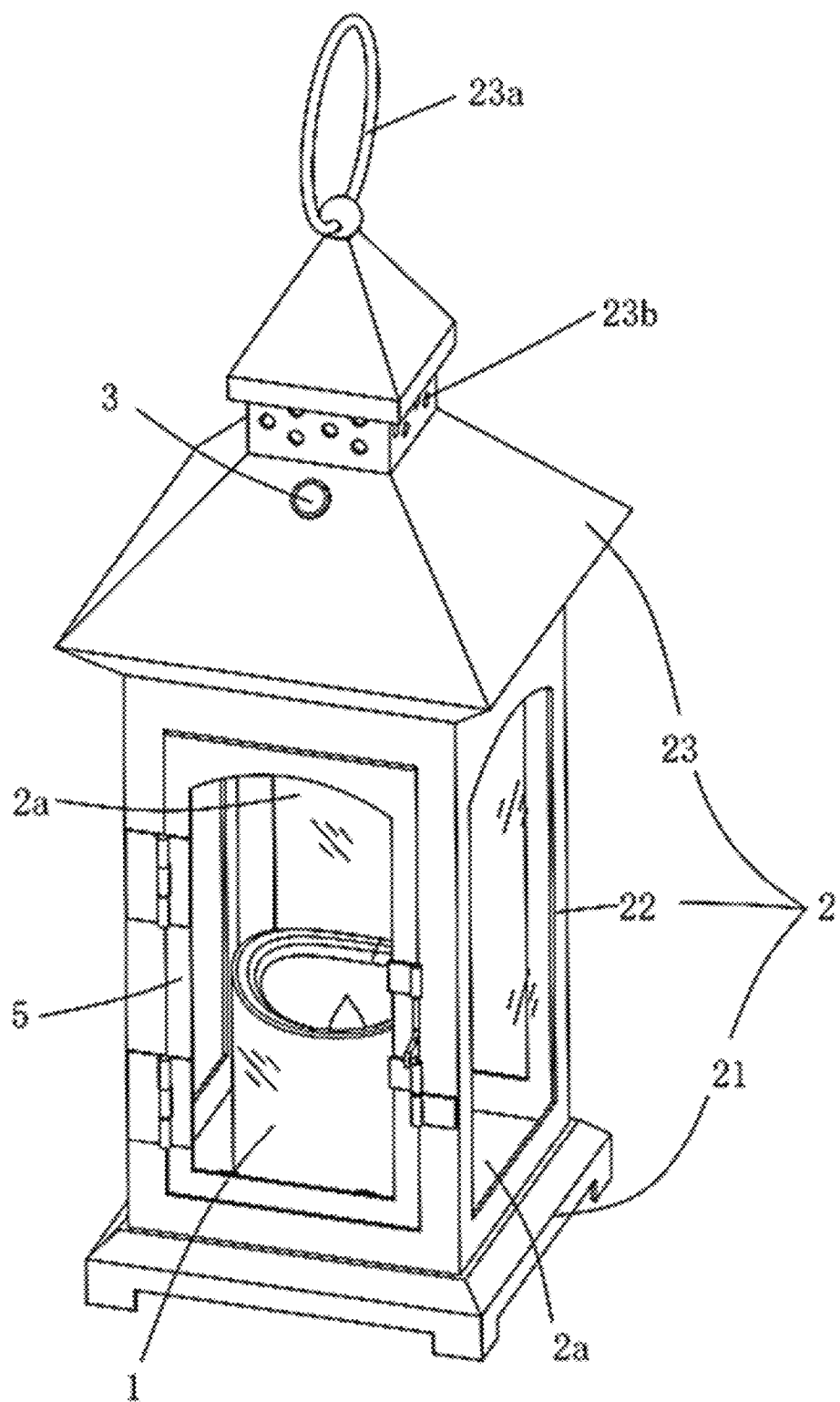
FIG. 1 is a schematic diagram of a perspective structure of the embodiment.

The present invention is further described in detail below with reference to the accompanying drawings and embodiments.

FIGS. 1-5 show a preferred embodiment of the present invention. The touch type sensor lantern of the embodiment mainly includes an electronic candle main body 1, a lantern outer cover 2, a sensor switch 3, a wire 4, a slide switch 6, batteries 7, etc.

Referring to FIG. 1 to FIG. 4, the electronic candle main body 1 can simulate a candle to give out light, the lantern outer cover 2 is provided with a base 21, the electronic candle main body 1 is placed in the lantern outer cover 2 and laid on the base 21, light transmitting glass 2a allowing people to see through is arranged on the lantern outer cover 2, the sensor switch 3 convenient for a human body to touch is also arranged at an upper part of the lantern outer cover 2, a circuit board 1a for controlling is arranged on the electronic candle main body 1, the circuit board 1a and the sensor switch 3 are electrically connected together through the wire 4 from bottom to top to form a control loop, and whether the electronic candle main body 1 gives out light or not and light colours of light given out are controlled by touching the sensor switch 3. Specifically, when the sensor switch 3 is touched for the first time, a circuit is turned on, and a light source of the electronic candle main body 1 starts to give out light; when the sensor switch 3 is touched for the second, third, fourth . . . time, the light source of the electronic candle main body 1 gives out different colours (changes from white, yellow, red, green, blue, etc. according to the customized programs); and when the sensor switch 3 is touched for the last time, the circuit is turned off, and the light source of the electronic candle main body 1 is turned off (disconnected).

Figure 3:
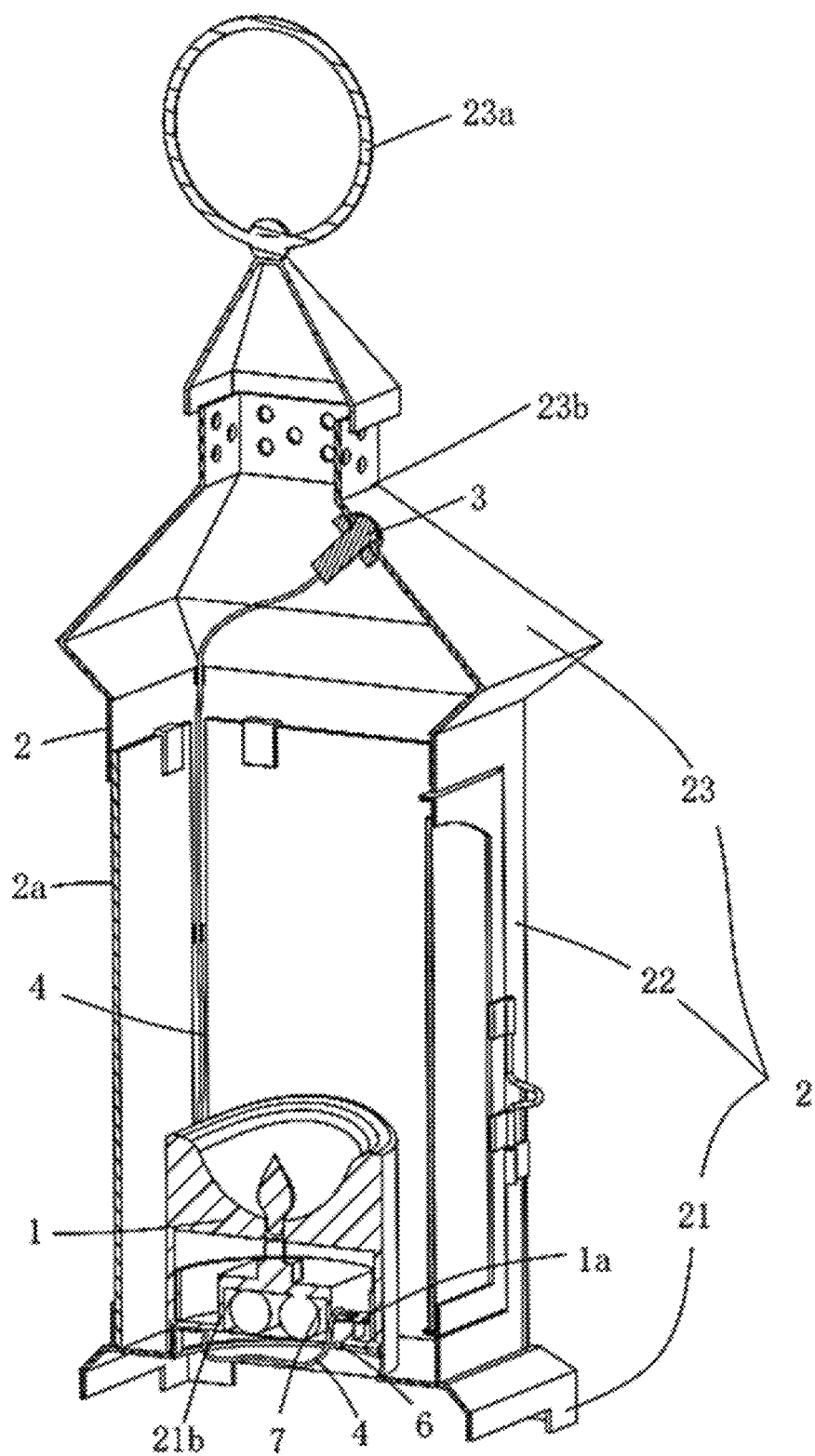
FIG. 3 is a sectional schematic diagram of the embodiment.

In order to optimize the overall structure of the lantern outer cover 2, whereby the lantern outer cover can better accommodate the electronic candle main body 1 and the sensor switch 3, referring to FIG. 1 and FIG. 3, in the embodiment, the lantern outer cover 2 further includes a light transmitting barrel 22 and a top cap 23, the light transmitting barrel 22 is arranged at an upper part of the base 21, the base 21 is arranged at a top of the light transmitting barrel 22 in a covering manner, the light transmitting glass 2a is arranged on a side wall of the light transmitting barrel 22, the sensor switch 3 is arranged on the top cap 23, and the wire 4 penetrates through the light transmitting barrel 22 from bottom to top to be connected to the sensor switch 3.

Figure 2:
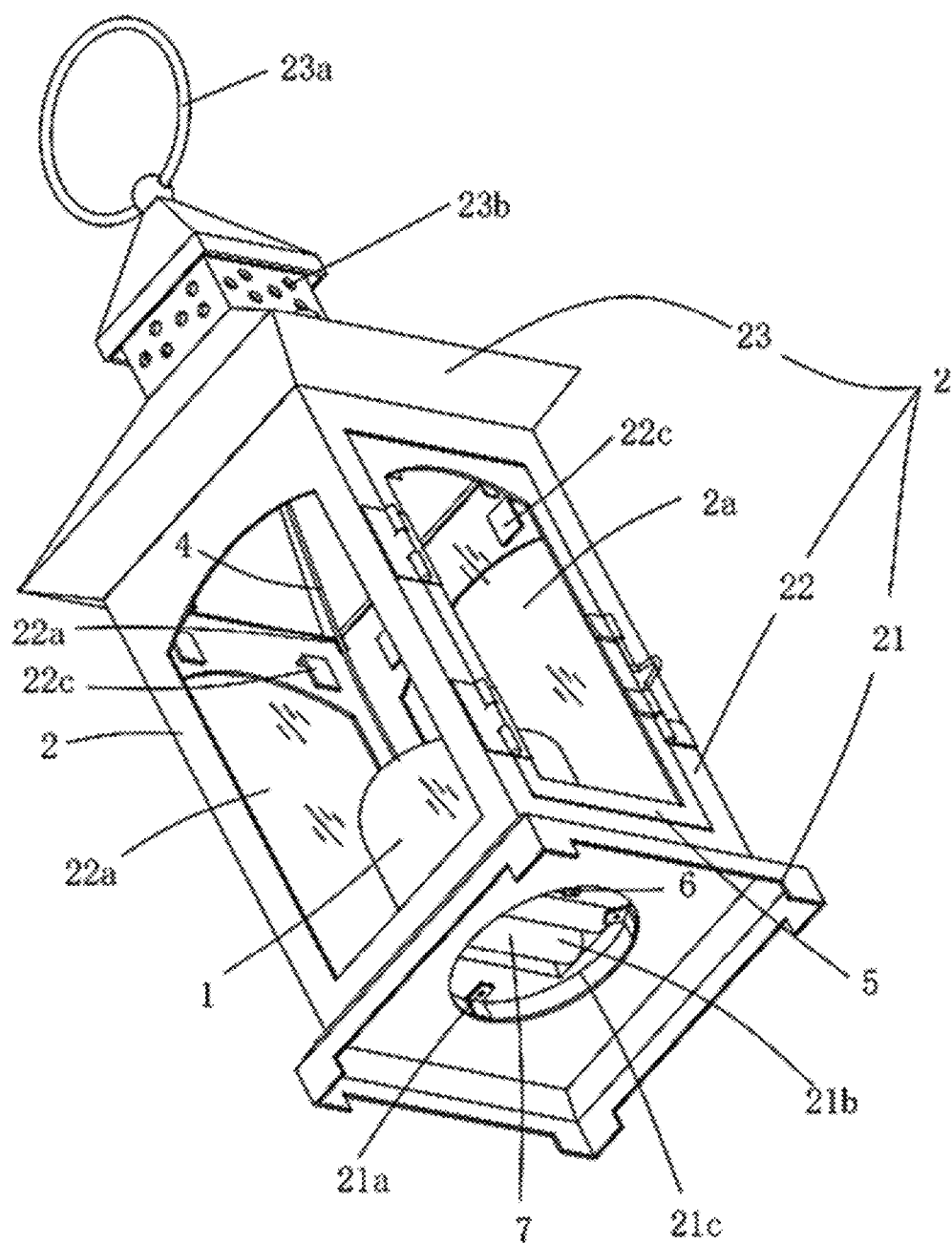
FIG. 2 is a schematic diagram of a perspective structure at another angle for a bottom of the embodiment.

Secondly, in order to conveniently fix the wire 4 and avoid the wire from being exposed outside to affect appearance, referring to FIG. 2 and FIG. 3, in the embodiment, a plurality of wire fixing clips 22a used for fixing the wire 4 are arranged on an inner side wall of the light transmitting barrel 22, and are arranged in a spacing manner in the length direction of the light transmitting barrel 22.

Meanwhile, in order to enable the lantern outer cover 2 to have better light transmittance, referring to FIG. 1 to FIG. 4, in the embodiment, a plurality of light transmitting holes 22b used for allowing light to transmit are formed in a side wall of the light transmitting barrel 22 in a circumferential direction in a penetrating manner, the light transmitting glass 2a is mounted on each light transmitting hole 22b, and fixing buckles 22c used for fixing the light transmitting glass 2a are further arranged on the light transmitting barrel 22.

Figure 5:
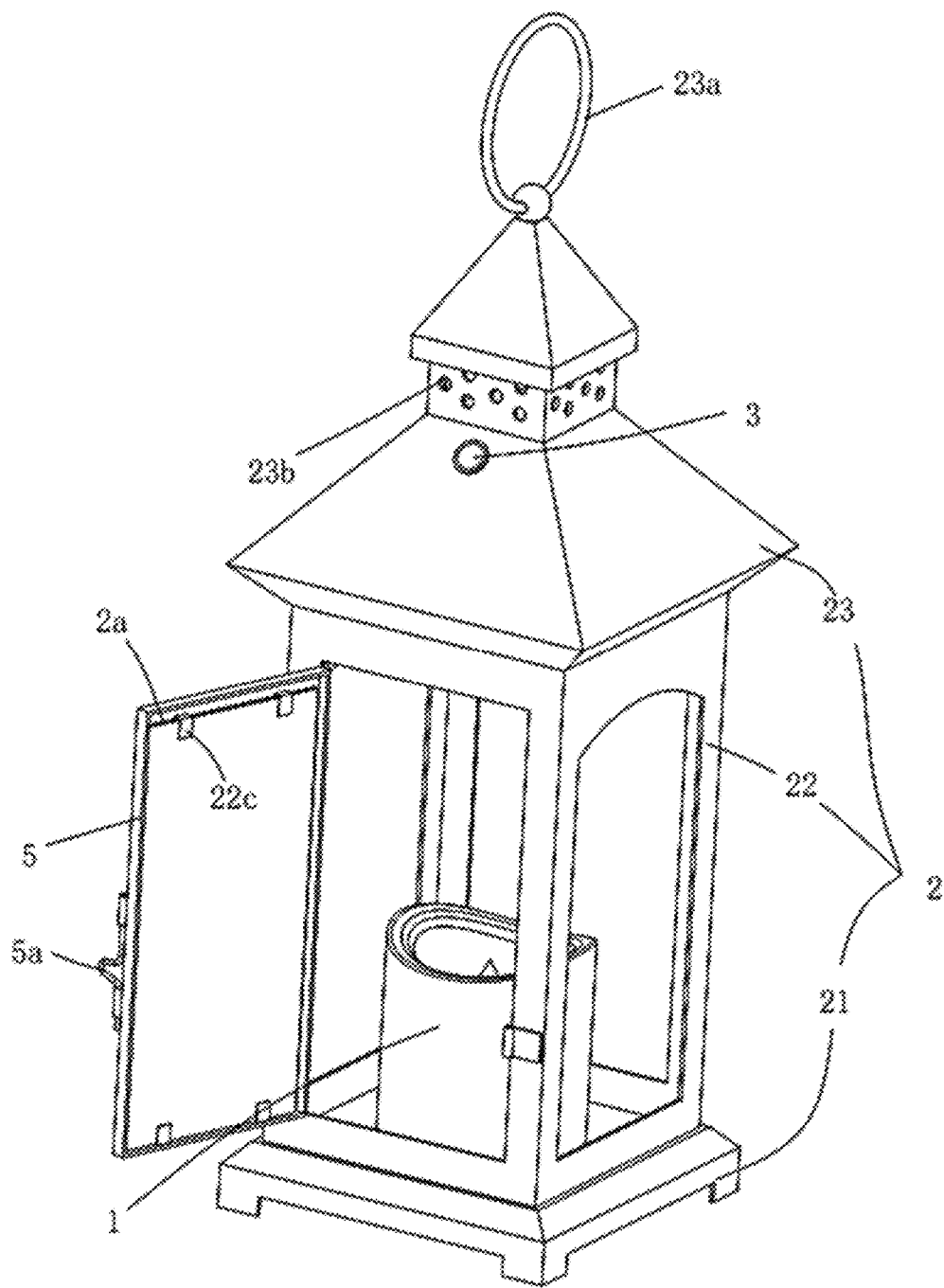
FIG. 5 is a schematic diagram of a perspective structure of a door body when being opened of the embodiment.

Furthermore, in order to enable the lantern of the embodiment to be more convenient to use and enable the lantern to be more conveniently maintained and replaced at a later stage, referring to FIG. 5, a door body 5 which can be opened or closed is further hinged to a side wall of the light transmitting barrel 22, the light transmitting holes 22b are formed in the door body 5 in a penetrating manner, the light transmitting glass 2a is further arranged on the light transmitting holes 22b of the door body 5, and a door lock is further arranged between the door body 5 and the light transmitting barrel 22.

Figure 4:
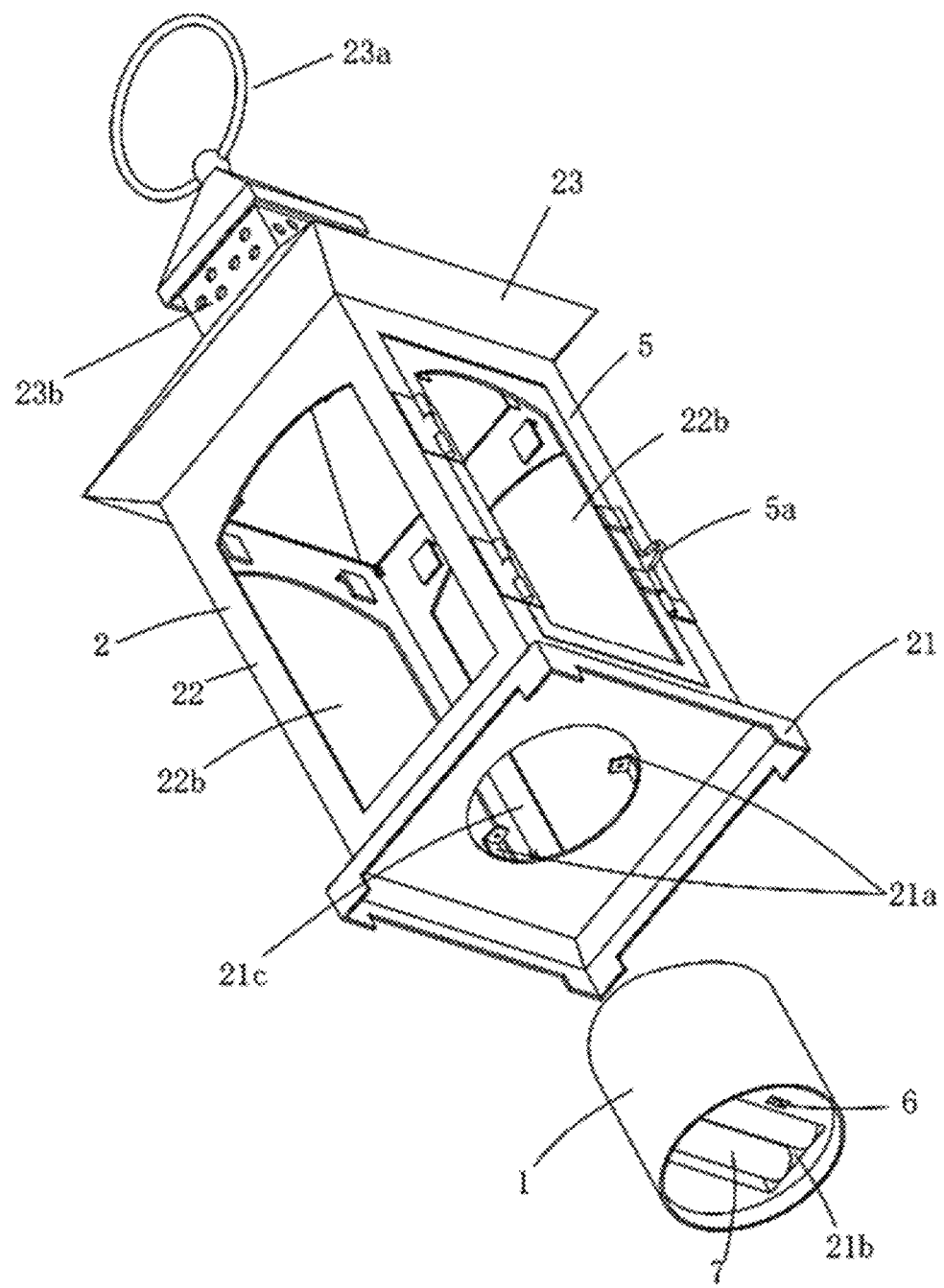
FIG. 4 is a schematic diagram of an exploded structure of a simulated flame head of the embodiment.

In addition, in order to enable the electronic candle main body 1 to be better mounted on the base 21 of the lantern outer cover 2, referring to FIG. 2 and FIG. 4, in the embodiment, support feet 21a used for allowing the electronic candle main body 1 to be mounted are arranged on the base 21, a battery compartment 21b used for allowing the batteries 7 to be mounted is arranged at a bottom of the electronic candle main body 1, and an operation hole 21c enabling the battery compartment 21b to be exposed outside is further formed in the base 21 in a penetrating manner.

In the embodiment, in order to enable the whole electronic candle to be better controlled, whereby the electronic candle can have a dual control function, referring to FIG. 2 and FIG. 3, in the embodiment, the slide switch 6 capable of controlling the electronic candle main body 1 to give out light or not is further arranged at a bottom of the electronic candle main body 1, the slide switch 6, the circuit board 1a, the sensor switch 3, and the batteries 7 placed in the battery compartment 21b are electrically connected together to form the control loop, on and off of a main line are realized by controlling the slide switch 6, and the slide switch 6 is correspondingly arranged above the operation hole 21c, whereby the slide switch 6 can be toggled back and forth conveniently.

Referring to FIG. 1, in order to enable the lantern to be conveniently hung outdoors, a hanging ring 23a or a pothook which can be overturned up and down is arranged at a top of the top cap 23 in the embodiment. In addition, a plurality of air ventilation holes 23b capable of communicating with the light transmitting barrel 22 are formed in the top cap 23, through the air ventilation holes 23b, the electronic candle main body 1 has better heat dissipation, and besides, the lantern can look more like a traditional lantern.

Additional illustrations need to be provided here, in the embodiment, the electronic candle main body 1 is placed in the lantern outer cover 2 and laid on the base 11, the light transmitting glass 2a allowing people to see through is arranged on the lantern outer cover 2, the sensor switch 3 convenient for a human body to touch is arranged at an upper part of the lantern outer cover 2, and the wire 4 which is connected to a circuit board 1a is arranged, whereby the wire 4 and the sensor switch 3 are electrically connected together from bottom to top to form a control loop, a user can conveniently control whether the electronic candle main body 1 gives out light or not and can control the light colours of the light given out by gently touching the sensor switch 3 located at an upper part of the lantern outer cover 2. This design addresses the disadvantage of the conventional design, whereby the entire lantern must be overturned in order to operate the switch button. The touch type sensor lantern is more simple and convenient to operate, and further user experience of users is improved.

It should be clarified that in the description of the embodiment, orientations or position relationships indicated by terms "front and back", "left and right", "up and down" etc. are orientations or position relationships as shown in the drawings, and these terms are just used to facilitate description of the present invention and simplify the description, but not to indicate or imply that the mentioned apparatus or elements must have a specific orientation and must be established and operated in a specific orientation, and thus, these terms cannot be understood as a limitation to the present invention. The terms "mount", "connected with", "connected to" should be comprehended in a broad sense. For example, these terms may be comprehended as being fixedly connected, detachably connected or integrally connected; or directly connected or indirectly connected through an intermediate medium, or in an internal communication between two elements. For those of ordinary skill in the art, the specific meaning of the above-mentioned terms in the present invention can be construed according to specific cases.

What is claimed is:

1. A touch type sensor lantern, comprising an electronic candle main body (1) capable of simulating a candle to give out light, and a lantern outer cover (2) with a base (21), wherein the electronic candle main body (1) is placed in the lantern outer cover (2) and laid on the base (21), light transmitting glass (2a) allowing people to see through is arranged on the lantern outer cover (2), a sensor switch (3) convenient for a human body to touch is also arranged at an upper part of the lantern outer cover (2), a circuit board (1a) for controlling is arranged on the electronic candle main body (1), the circuit board (1a) and the sensor switch (3) are electrically connected together through a wire (4) from bottom to top to form a control loop, the electronic candle main body (1) is controlled to turn on or turn off by touching the sensor switch (3), and when the electronic candle main body (1) is turned on, the electronic candle main body (1) changes light colours each time the sensor switch (3) is touched, and wherein support feet (21a) used for allowing the electronic candle main body (1) to be mounted are arranged on the base (21), a battery compartment (21b) used for allowing batteries (7) to be mounted is arranged at a bottom of the electronic candle main body (1), and an operation hole (21c) enabling the battery compartment (21b) to be exposed outside for replacing the batteries (7) is further formed in the base (21) in a penetrating manner.

2. The touch type sensor lantern according to claim 1, wherein the lantern outer cover (2) further comprises a light transmitting barrel (22) and a top cap (23), the light transmitting barrel (22) is arranged at an upper part of the base (21), the top cap (23) is arranged at a top of the light transmitting barrel (22) in a covering manner, the light transmitting glass (2a) is arranged on a side wall of the light transmitting barrel (22), the sensor switch (3) is arranged on the top cap (23), and the wire (4) penetrates through the light transmitting barrel (22) from bottom to top to be connected to the sensor switch (3).

3. The touch type sensor lantern according to claim 2, wherein a plurality of wire fixing clips (22a) used for fixing the wire (4) are arranged on an inner side wall of the light transmitting barrel (22), and are arranged in a spacing manner in a length direction of the light transmitting barrel (22).

4. The touch type sensor lantern according to claim 2, wherein a plurality of light transmitting holes (22b) used for allowing light to transmit are formed in a side wall of the light transmitting barrel (22) in a circumferential direction in a penetrating manner, the light transmitting glass (2a) is mounted on each light transmitting hole (22b), and fixing buckles (22c) used for fixing the light transmitting glass (2a) are further arranged on the light transmitting barrel (22).

5. The touch type sensor lantern according to claim 2, wherein a door body (5) which can be opened or closed is further hinged to a side wall of the light transmitting barrel (22), the light transmitting holes (22b) are formed in the door body (5) in a penetrating manner, the light transmitting glass (2a) is further arranged on the light transmitting holes (22b) of the door body (5), and a door lock (5a) is further arranged between the door body (5) and the light transmitting barrel (22).

6. The touch type sensor lantern according to claim 2, wherein a slide switch (6) capable of controlling the electronic candle main body (1) to give out light or not is further arranged at a bottom of the electronic candle main body (1), the slide switch (6), the circuit board (Ia), the sensor switch (3), and the batteries (7) placed in the battery compartment (21*b*) are electrically connected together to form the control loop, on and off of a main line are realized by controlling the slide switch (6), and the slide switch (6) is correspondingly arranged above the operation hole (21*c*), whereby the slide switch (6) can be toggled back and forth conveniently.

7. The touch type sensor lantern according to claim 2, wherein a hanging ring (23*a*) or a pothook which can be overturned up and down is arranged at a top of the top cap (23).

8. The touch type sensor lantern according to claim 2, wherein a plurality of air ventilation holes (23*b*) capable of communicating with the light transmitting barrel (22) are formed in the top cap (23).

9. The touch type sensor lantern according to claim 2, wherein the sensor switch (3) can further control light colours of light given out by the electronic candle main body (1).

\* \* \* \* \*